US012562335B2

(12) United States Patent
Yoshida et al.

(10) Patent No.: US 12,562,335 B2
(45) Date of Patent: Feb. 24, 2026

(54) SAMPLE INSPECTION APPARATUS, INSPECTION SYSTEM, THIN PIECE SAMPLE FABRICATION APPARATUS, AND METHOD FOR INSPECTING SAMPLE

(71) Applicant: Hitachi High-Tech Corporation, Tokyo (JP)

(72) Inventors: Masahiro Yoshida, Tokyo (JP); Junichi Fuse, Tokyo (JP); Norio Sato, Tokyo (JP); Hirotsugu Kajiyama, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 343 days.

(21) Appl. No.: 18/286,607

(22) PCT Filed: Apr. 13, 2021

(86) PCT No.: PCT/JP2021/015247

§ 371 (c)(1),
(2) Date: Oct. 12, 2023

(87) PCT Pub. No.: WO2022/219695

PCT Pub. Date: Oct. 20, 2022

(65) Prior Publication Data

US 2024/0128047 A1     Apr. 18, 2024

(51) Int. Cl.
*H01J 37/20*     (2006.01)
*H01J 37/22*     (2006.01)
(Continued)

(52) U.S. Cl.
CPC ............ *H01J 37/20* (2013.01); *H01J 37/222* (2013.01); *H01J 37/244* (2013.01);
(Continued)

(58) Field of Classification Search
CPC ........ H01J 37/20; H01J 37/222; H01J 37/244; H01J 37/265; H01J 37/28;
(Continued)

(56) References Cited

U.S. PATENT DOCUMENTS

2002/0105577 A1     8/2002   Nikawa
2003/0057971 A1     3/2003   Nishiyama et al.
(Continued)

FOREIGN PATENT DOCUMENTS

JP      2000-269291 A     9/2000
JP      2003-100823 A     4/2003
(Continued)

OTHER PUBLICATIONS

Katakura et al. "Analyzing CMOS Image Sensors by Dynamic Induced Electron-beam Absorbed Current Method", Scientific Instrument News vol. 18, Sep. 2022 (Year: 2022).*
(Continued)

*Primary Examiner* — Nicole M Ippolito
(74) *Attorney, Agent, or Firm* — Crowell & Moring LLP

(57)     ABSTRACT

A sample inspection apparatus is provided. The invention is directed to a sample inspection apparatus 200 that includes an inspection means that is executed when a sample 11 is placed on a stage 8, the inspection means including the steps of (a) scanning a surface of the sample 11 with an electron beam EB1 with a probe 10a in contact with a conductor 11a and a probe 10b in contact with a conductor 11b, (b) measuring a differential value of a change in potential difference between the probes 10a and 10b while synchronizing with the scanning of the electron beam EB1, (c) acquiring a DI-EBAC image in which a fault spot 12 existing between the conductors 11a and 11b is shown as a bright part and a dark part based on the differential value of
(Continued)

the change in the potential difference, and (d) specifying a direction of the fault spot 12 from the DI-EBAC image.

14 Claims, 10 Drawing Sheets

(51) Int. Cl.

| | | |
|---|---|---|
| *H01J 37/24* | (2006.01) | |
| *H01J 37/244* | (2006.01) | |
| *H01J 37/26* | (2006.01) | |
| *H01J 37/28* | (2006.01) | |

(52) U.S. Cl.
CPC ............ *H01J 37/265* (2013.01); *H01J 37/28* (2013.01); *H01J 2237/2448* (2013.01); *H01J 2237/24564* (2013.01); *H01J 2237/24592* (2013.01); *H01J 2237/2817* (2013.01)

(58) Field of Classification Search
CPC ..... H01J 2237/2448; H01J 2237/24564; H01J 2237/24592; H01J 2237/2817
See application file for complete search history.

(56) References Cited

U.S. PATENT DOCUMENTS

| | | |
|---|---|---|
| 2004/0178811 A1 | 9/2004 | Ishitani et al. |
| 2008/0135754 A1 | 6/2008 | Eto |
| 2011/0291692 A1 | 12/2011 | Ando et al. |
| 2018/0246166 A1* | 8/2018 | Kageyama ............ H01J 37/268 |
| 2021/0027455 A1 | 1/2021 | Kimizuka et al. |
| 2021/0270891 A1 | 9/2021 | Komori et al. |

FOREIGN PATENT DOCUMENTS

| | | | |
|---|---|---|---|
| JP | 2005-114578 | A | 4/2005 |
| JP | 2008-166702 | A | 7/2008 |
| JP | 2008-203075 | A | 9/2008 |
| JP | 2021-22440 | A | 2/2021 |
| KR | 10-2018-0130049 | A | 12/2018 |
| WO | WO 01/63660 | A1 | 8/2001 |
| WO | WO 2010/089959 | A9 | 8/2010 |
| WO | WO 2017/038293 | A1 | 3/2017 |
| WO | WO 2020/003458 | A1 | 1/2020 |

OTHER PUBLICATIONS

International Search Report (PCT/ISA/210) issued in PCT Application No. PCT/JP2021/015247 dated Jun. 29, 2021 with English translation (6 pages).
Japanese-language Written Opinion (PCT/ISA/237) issued in PCT Application No. PCT/JP2021/015247 dated Jun. 29, 2021 with English translation (9 pages).
Korean-language Office Action issued in Korean Application No. 10-2023-7034028 dated Aug. 7, 2024 with English translation (32 pages).

* cited by examiner

[FIG. 1]
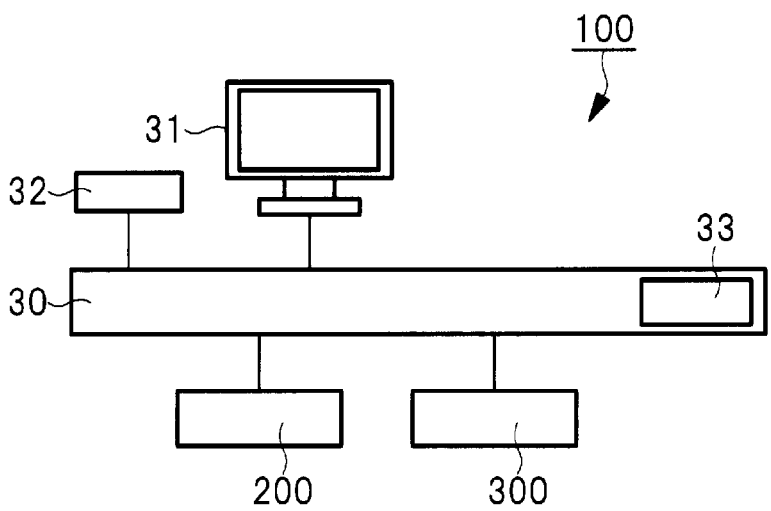

[FIG. 2]
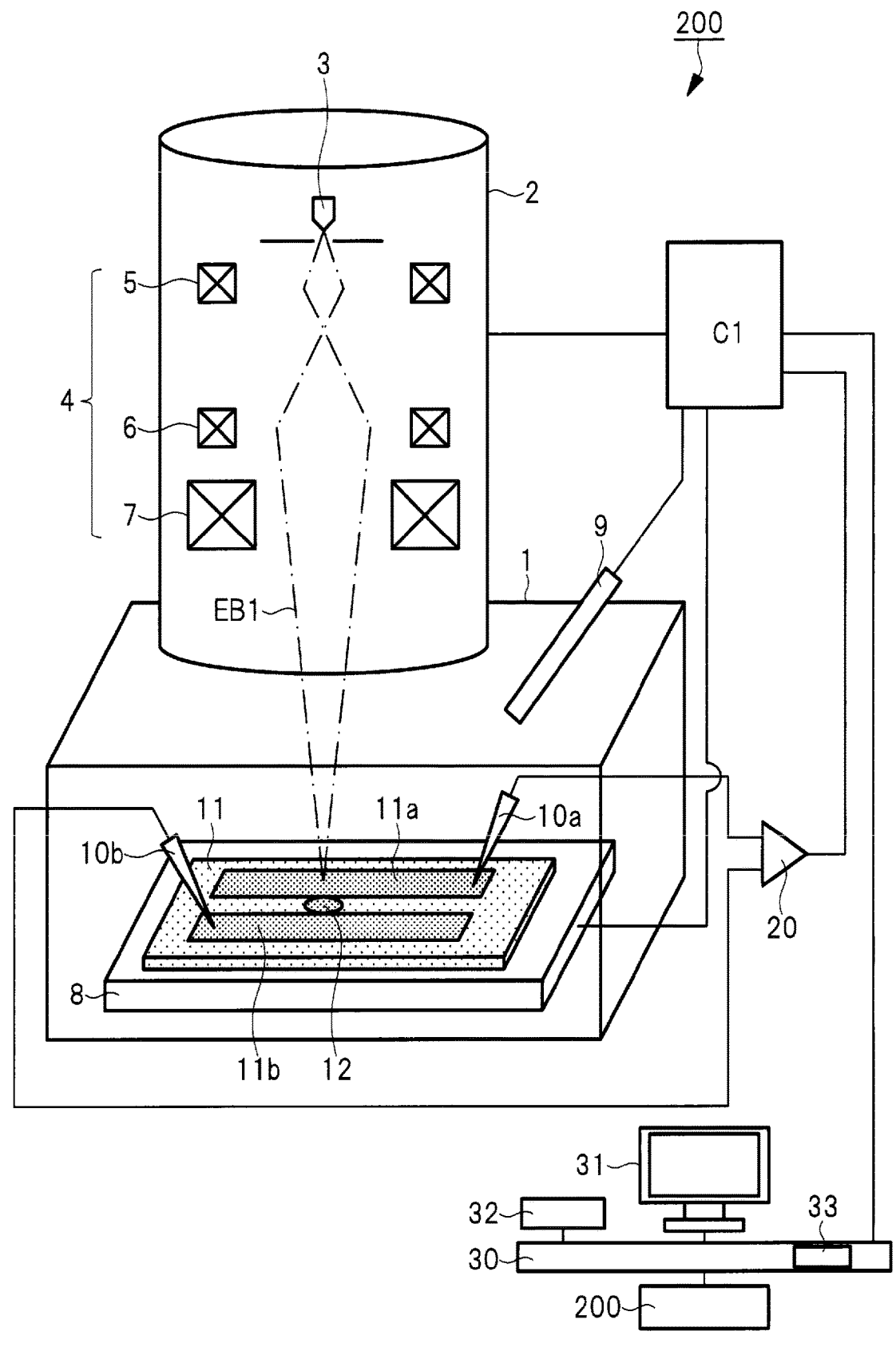

[FIG. 3]
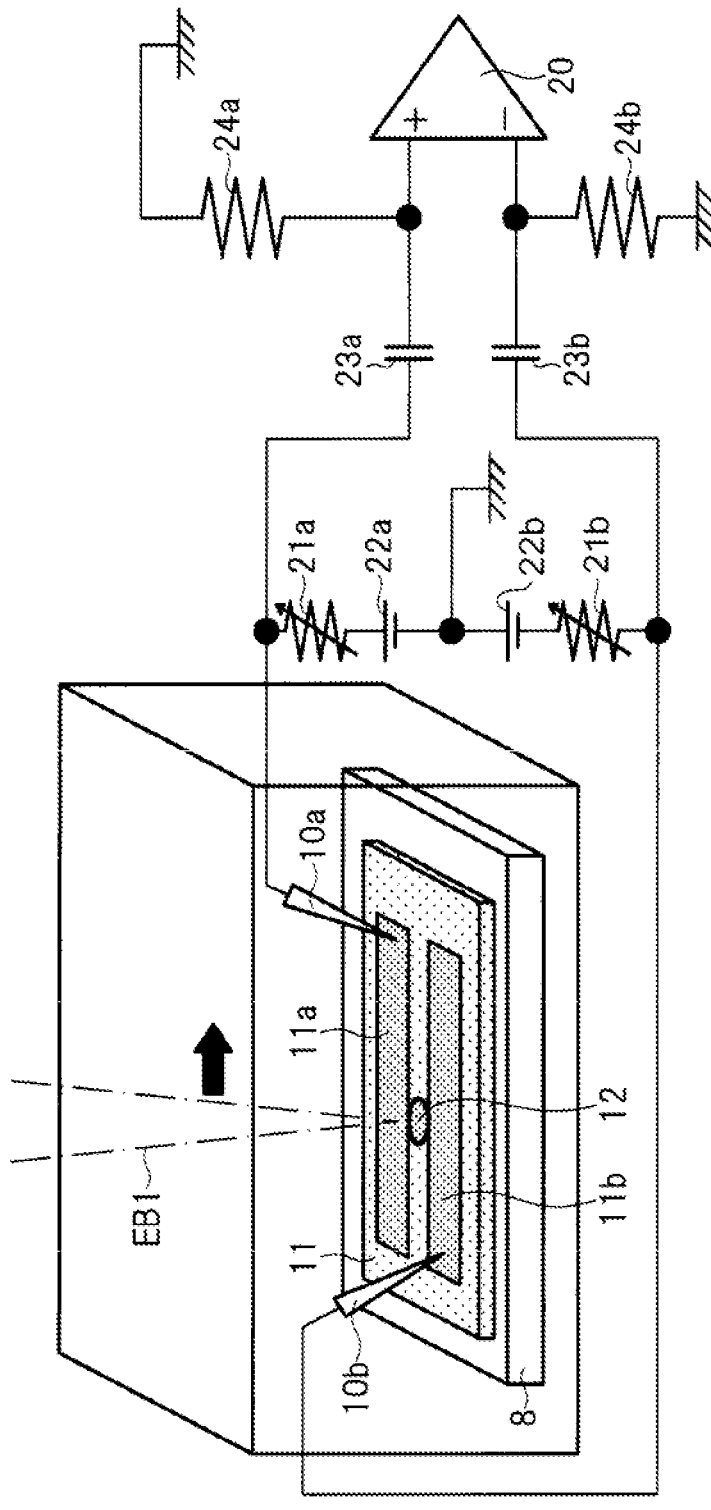

[FIG. 4]
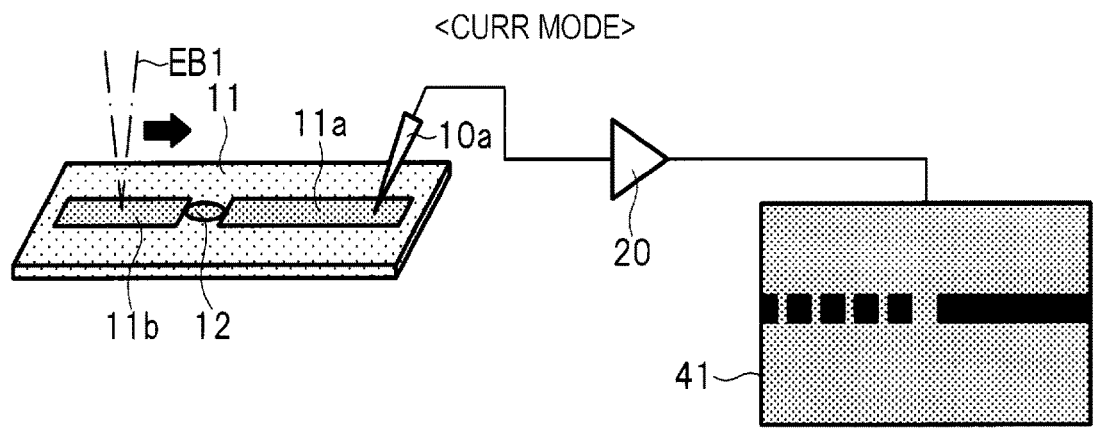
<CURR MODE>
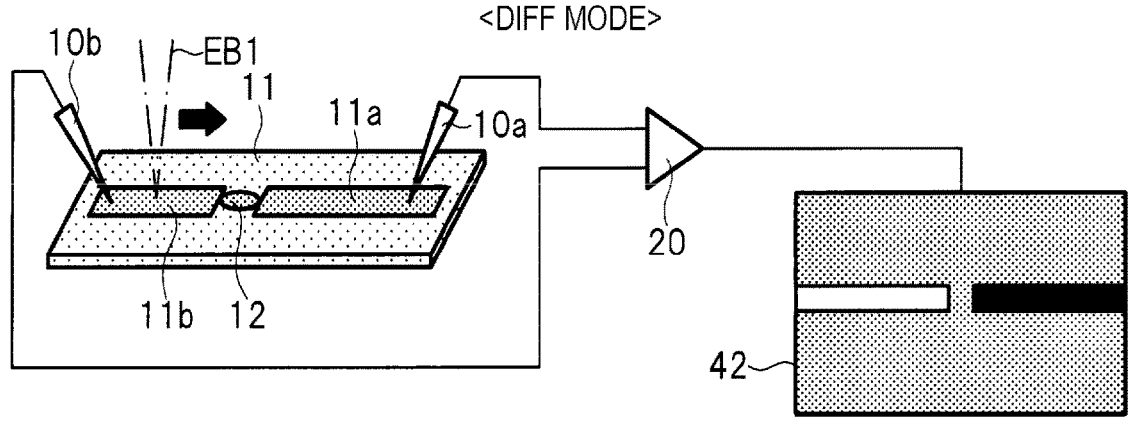
<DIFF MODE>
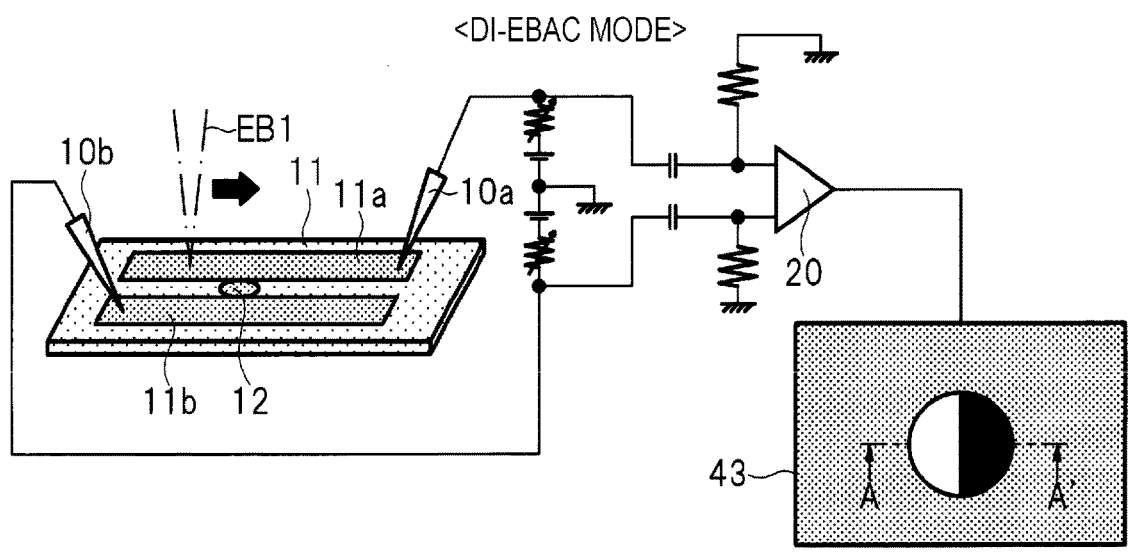
<DI-EBAC MODE>

[FIG. 5]
<CURR MODE>
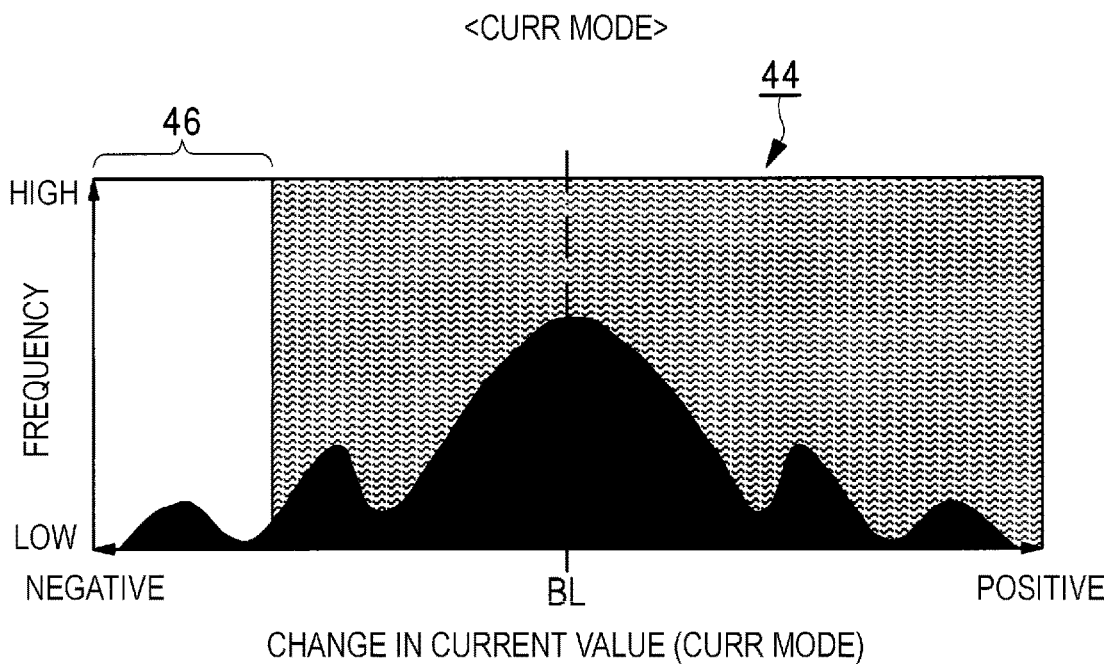
CHANGE IN CURRENT VALUE (CURR MODE)
<DIFF MODE, DI-EBAC MODE>
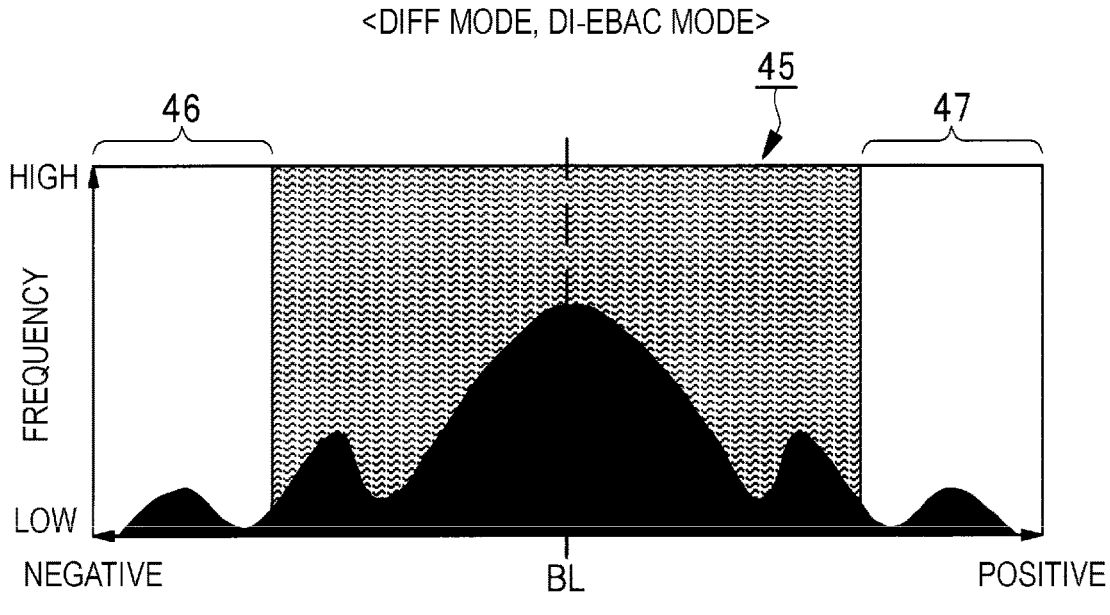
CHANGE IN CURRENT VALUE (DIFF MODE)
DIFFERENTIAL VALUE OF CHANGE IN POTENTIAL DIFFERENCE
(DI-EBAC MODE)

[FIG. 6]
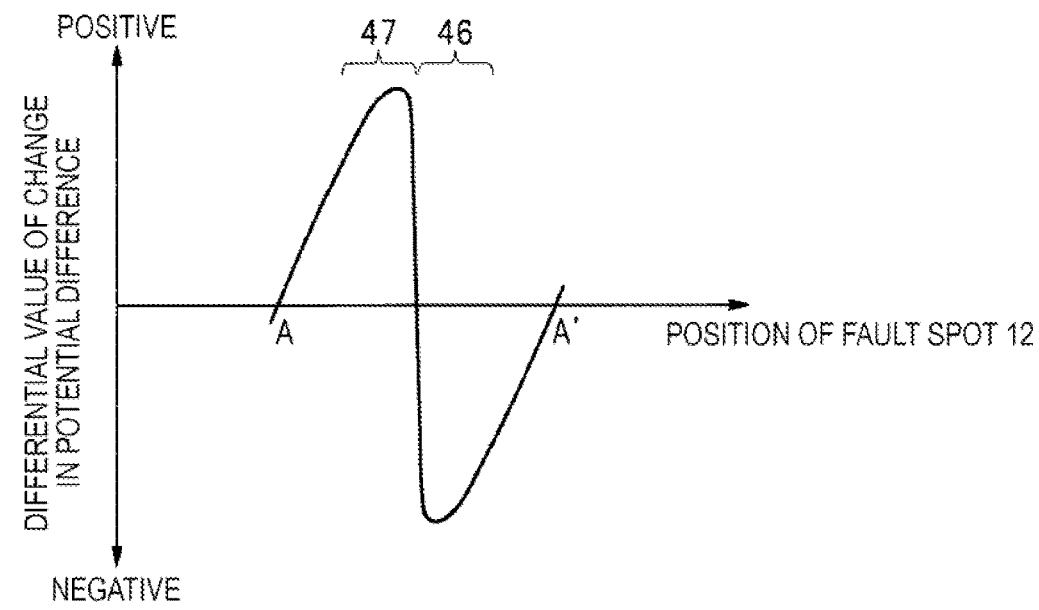
[FIG. 7]
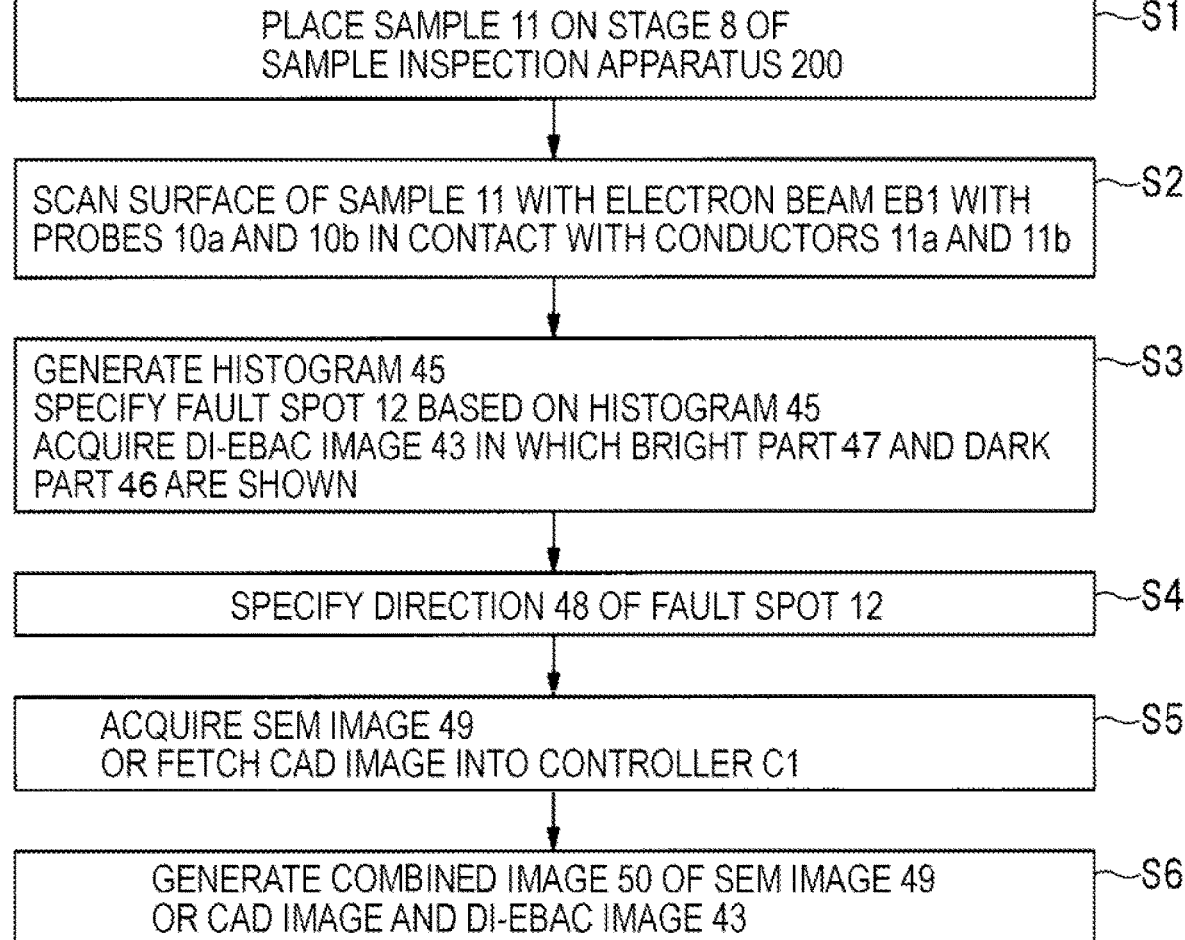

[FIG. 8A]
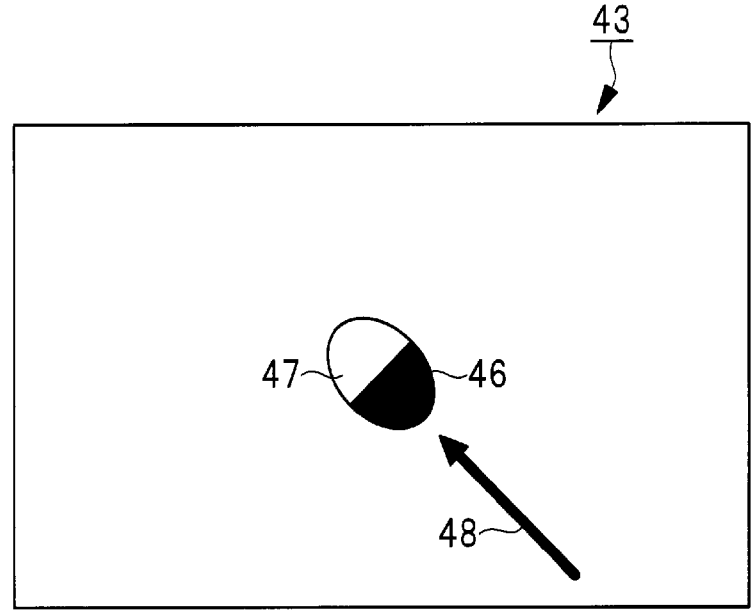
[FIG. 8B]
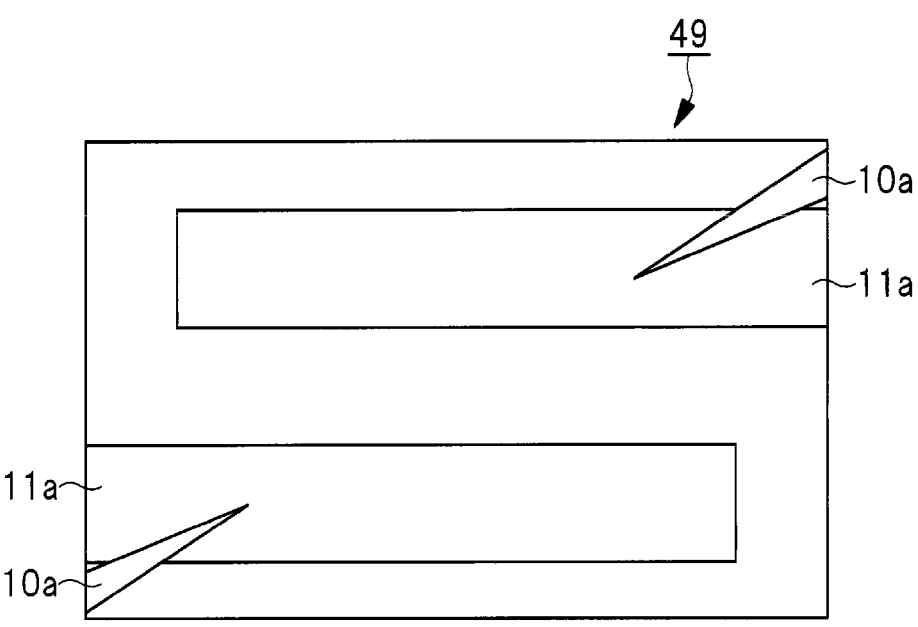

[FIG. 8C]
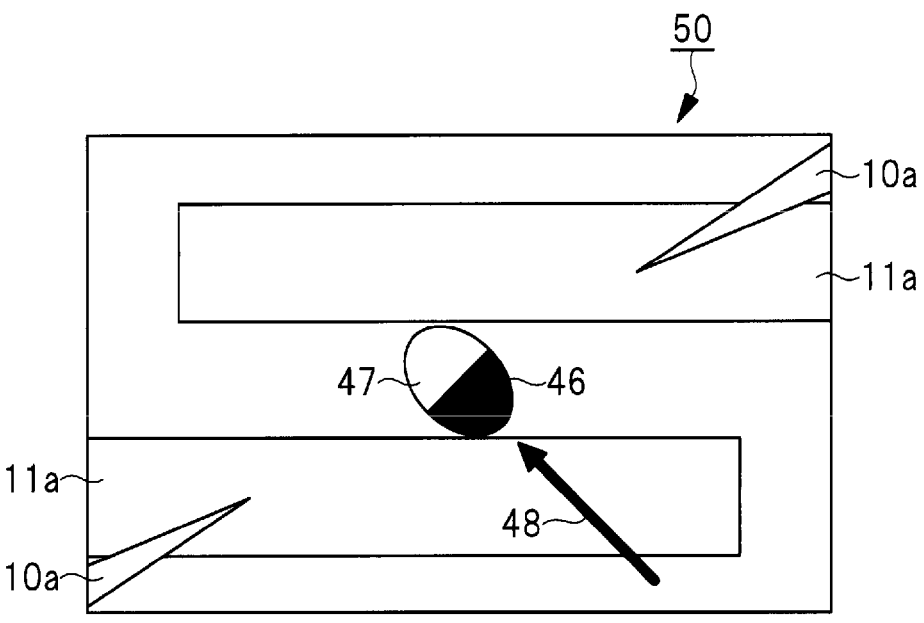
[FIG. 8D]
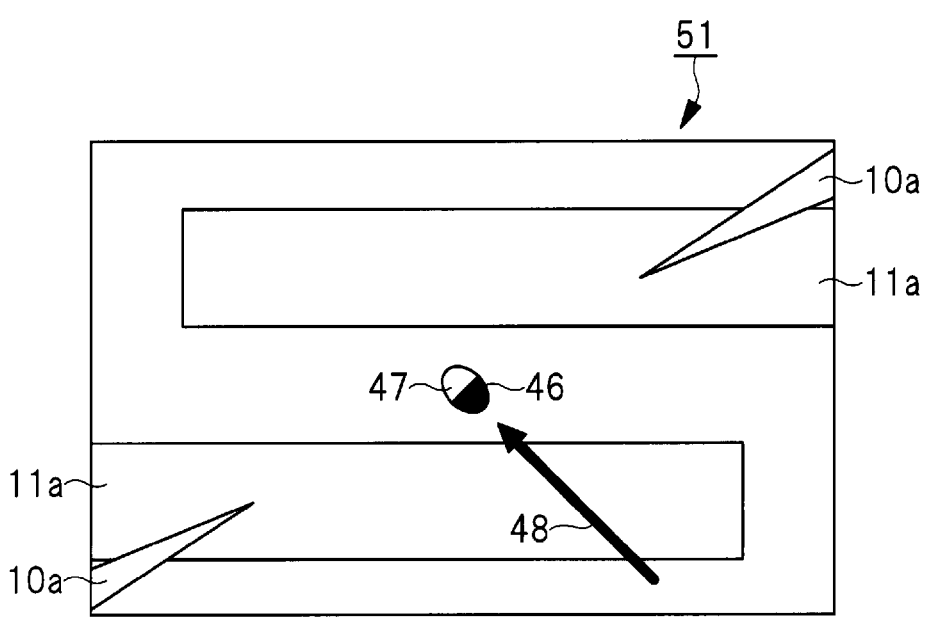

[FIG. 9]
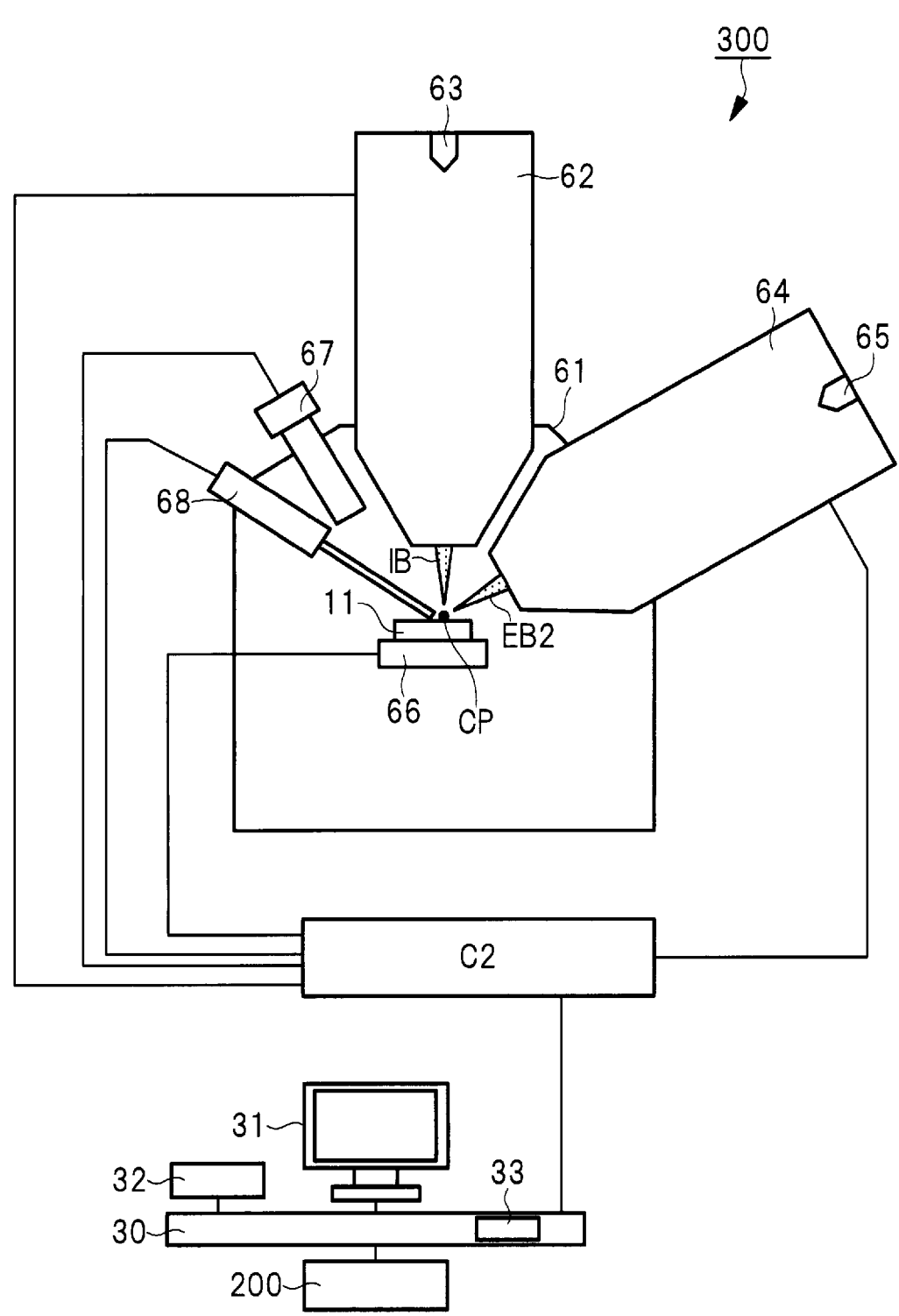

[FIG. 10]
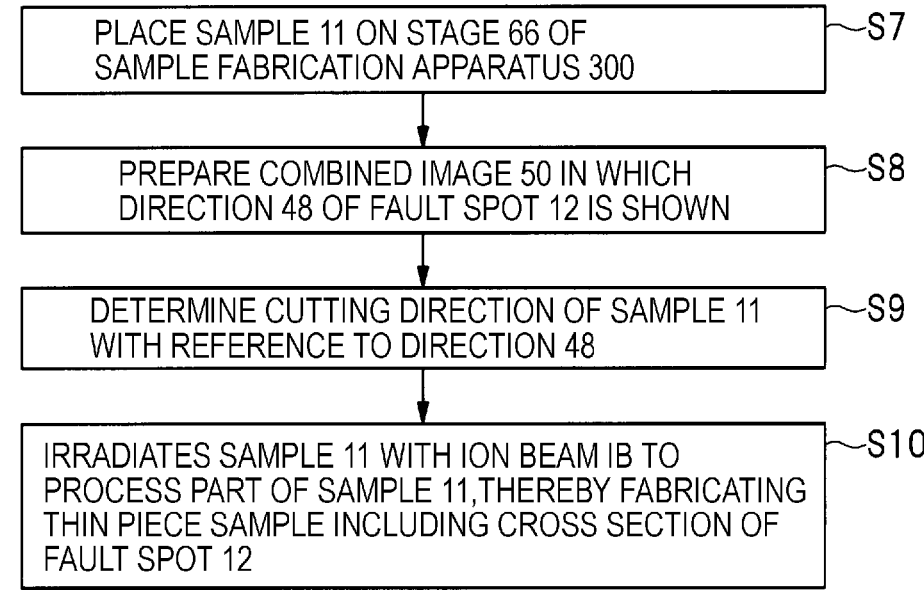
```
PLACE SAMPLE 11 ON STAGE 66 OF          ⌐S7
SAMPLE FABRICATION APPARATUS 300
PREPARE COMBINED IMAGE 50 IN WHICH      ⌐S8
DIRECTION 48 OF FAULT SPOT 12 IS SHOWN
DETERMINE CUTTING DIRECTION OF SAMPLE 11   ⌐S9
WITH REFERENCE TO DIRECTION 48
IRRADIATES SAMPLE 11 WITH ION BEAM IB TO   ⌐S10
PROCESS PART OF SAMPLE 11,THEREBY FABRICATING
THIN PIECE SAMPLE INCLUDING CROSS SECTION OF
FAULT SPOT 12
```
[FIG. 11]
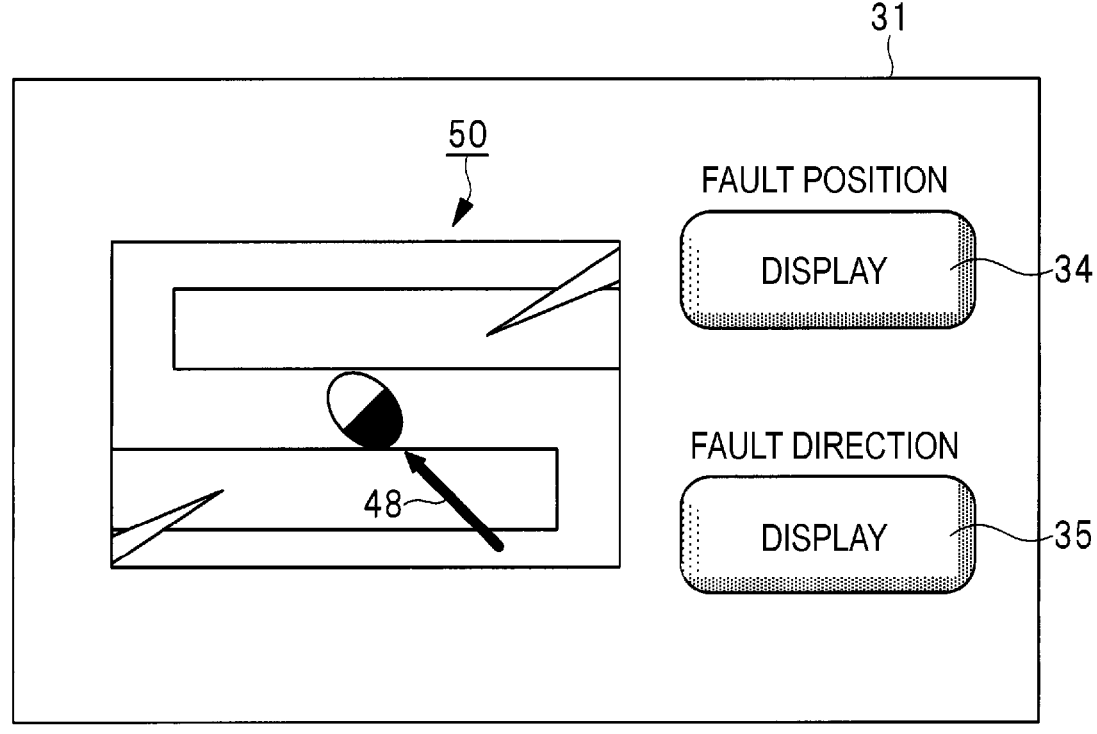

SAMPLE INSPECTION APPARATUS, INSPECTION SYSTEM, THIN PIECE SAMPLE FABRICATION APPARATUS, AND METHOD FOR INSPECTING SAMPLE

TECHNICAL FIELD

The present invention relates to a sample inspection apparatus, an inspection system, a thin piece sample fabrication apparatus, and a method for inspecting a sample, and more particularly, to a sample inspection apparatus capable of specifying a direction of a fault spot, a method for inspecting a sample using the sample inspection apparatus, a thin piece sample fabrication apparatus capable of fabricating the sample using image data in which the direction of the fault spot is specified, and an inspection system including the sample inspection apparatus and the thin piece sample fabrication apparatus.

BACKGROUND ART

In recent years, miniaturization of semiconductor devices is progressing. In particular, in the semiconductor device having a three-dimensional structure, high integration and large capacity are rapidly progressing by being combined with a stacking technique. A scanning electron microscope (SEM) or the like is used as a charged particle beam apparatus for analyzing such a semiconductor device.

In fault analysis of a semiconductor sample on which a complicated circuit is formed, it becomes difficult to specify a fault spot according to the miniaturization of the semiconductor device, and an enormous amount of time is required for the analysis. Currently, an analysis apparatus such as an optical beam induced resistance change (OBIRCH) or an electron beam (EB) tester is used for such fault analysis.

In particular, in the field of fault analysis of a wiring, a technique of irradiating the semiconductor sample with a charged particle beam represented by an electron beam, bringing a probe into contact with the sample, analyzing the current absorbed by the wiring or a secondary signal emitted from the semiconductor sample (secondary electrons or reflected electrons, and the like), and imaging the sample is attracting attention. A distribution image of a signal (absorbed current signal) obtained based on the current (absorbed current) absorbed by the wiring is called an electron beam absorbed current (EBAC) image.

For example, PTL 1 discloses an absorbed current detection apparatus that irradiates a wiring pattern on a surface of a sample with a charged particle beam and measures the absorbed current that flows between two probes in contact with the wiring pattern. In this apparatus, an input resistor for output voltage adjustment having a predetermined resistance value is inserted between a current/voltage converter that converts the measured absorbed current into a voltage and the wiring pattern.

Further, PTL 2 discloses a technique of scanning a sample with a charged particle beam while applying a voltage to a circuit specified by the contact of a scanning electron microscope (SEM) probe via the probe, and measuring a change in resistance value of a locally heated fault spot via the probe. With this configuration, it becomes easier to detect a signal caused by a fault spot having high resistance that was difficult to detect by the conventional EBAC method or a fault spot buried inside the sample. Further, PTL 2 discloses a technique for specifying a position of the fault spot by superimposing an acquired EBAC image and a SEM image.

CITATION LIST

Patent Literature

PTL 1: JP2008-203075A
PTL 2: WO2017/038293A

SUMMARY OF INVENTION

Technical Problem

In PTL 2, it is possible to characterize the position of the fault spot with a certain degree of accuracy by a combined image obtained by superimposing the EBAC image and the SEM image, but, for example, it is not possible to specify a direction of short-circuiting in a short-circuit fault. Therefore, in a process of cutting the fault spot and thinning the film thereof, and observing a cross section of the fault spot using a thin piece sample fabrication apparatus such as a focused ion beam (FIB) apparatus or FIB-SEM apparatus, the fault spot may be cut in an inappropriate direction and information on the fault spot may be lost.

A main object of the present application is to provide a sample inspection apparatus capable of specifying a fault direction from an EBAC image, and an inspection method using the sample inspection apparatus. Another object of the present invention is to fabricate a thin piece sample, so that a fault spot is cut in an appropriate direction by using information acquired by the sample inspection apparatus in the thin piece sample fabrication apparatus. Other problems and novel features will become apparent from the description of the specification and the accompanying drawings.

Solution to Problem

Among the embodiments disclosed in the present application, a brief outline of representative ones is as follows.

A charged particle beam apparatus in one embodiment includes an electron source capable of emitting an electron beam, an electron optical system capable of focusing and scanning the electron beam, a first stage on which a sample having a first conductor and a second conductor formed on a surface thereof can be placed, a detector for detecting secondary electrons generated from the sample when the sample is irradiated with the electron beam, a first probe, a second probe, a first controller that controls an operation of each of the electron source, the electron optical system, the first stage, the detector, the first probe, and the second probe, and an inspection means that is executed when the sample is placed on the first stage. Here, the inspection means includes the steps of (a) scanning the surface of the sample with the electron beam with the first probe in contact with the first conductor and the second probe in contact with the second conductor, (b) measuring a differential value of a change in potential difference between the first probe and the second probe while synchronizing with the scanning of the electron beam in the step (a), (c) acquiring a DI-EBAC image in which a fault spot existing between the first conductor and the second conductor is shown as a bright part and a dark part based on the differential value of the change in the potential difference measured in the step (b), and (d) specifying a direction of the fault spot from the DI-EBAC image acquired in the step (c).

A thin piece sample fabrication apparatus in one embodiment includes an ion source capable of emitting an ion beam, a second stage on which a sample having a first conductor and a second conductor formed on a surface thereof can be placed, a second controller that controls an operation of each of the ion source and the second stage, and a fabrication means executed when the sample is placed on the second stage. Here, the fabrication means includes the steps of (a) fabricating a combined image, which is obtained by superimposing a SEM image in which the first conductor and the second conductor are captured or a CAD image which is design data of the sample and in which the first conductor and the second conductor are shown, and a DI-EBAC image in which a fault spot existing between the first conductor and the second conductor is shown as a bright part and a dark part, and in which a direction of the fault spot is shown, (b) after the step (a), determining a cutting direction of the sample with reference to the direction of the fault spot shown in the combined image, and (c) after the step (b), irradiating the sample with the ion beam based on the cutting direction and processing a part of the sample to fabricate a thin piece sample including a cross section of the fault spot.

A method for inspecting a sample according to one embodiment is performed using a sample inspection apparatus and a thin piece sample fabrication apparatus. The sample inspection apparatus includes an electron source capable of emitting an electron beam, an electron optical system capable of focusing and scanning the electron beam, a first stage on which a sample having a first conductor and a second conductor formed on a surface thereof can be placed, a detector for detecting secondary electrons generated from the sample when the sample is irradiated with the electron beam, a first probe, a second probe, and a first controller that controls an operation of each of the electron source, the electron optical system, the first stage, the detector, the first probe, and the second probe. The thin piece sample fabrication apparatus includes an ion source capable of emitting an ion beam, a second stage on which the sample can be placed, and a second controller that controls an operation of each of the ion source and the second stage and is electrically connected to the first controller. Further, the method for inspecting the sample includes the steps of (a) placing the sample on the first stage, (b) after the step (a), scanning the surface of the sample with the electron beam with the first probe in contact with the first conductor and the second probe in contact with the second conductor, (c) measuring a differential value of a change in potential difference between the first probe and the second probe while synchronizing with the scanning of the electron beam in the step (b), (d) acquiring a DI-EBAC image in which a fault spot existing between the first conductor and the second conductor is shown as a bright part and a dark part based on the differential value of the change in the potential difference measured in the step (c), (f) specifying a direction of the fault spot from the DI-EBAC image acquired in the step (d), (g) acquiring a SEM image in which the first conductor and the second conductor are imaged by detecting secondary electrons generated from the sample with the detector while synchronizing with the scanning of the electron beam in the step (a) or fetching a CAD image, which is design data of the sample and in which the first conductor and the second conductor are shown, into the first controller, (h) after the step (f) and the step (g), specifying the position of the fault spot by acquiring a combined image obtained by superimposing the SEM image or the CAD image and the DI-EBAC image, (i) after the step (h), transporting the sample from the sample inspection apparatus to the thin piece sample fabrication apparatus and placing the sample on the second stage, (j) fetching the combined image acquired in the step (h) and information on the direction of the fault spot specified in the step (f) from the first controller to the second controller, (k) after the step (j), showing the direction of the fault spot in the combined image, (l) after the step (k), determining a cutting direction of the sample with reference to the direction of the fault spot, and (m) after the step (l), irradiating the sample with the ion beam based on the cutting direction and processing a part of the sample to fabricate a thin piece sample including a cross section of the fault spot.

Advantageous Effects of Invention

According to one embodiment, it is possible to provide a sample inspection apparatus that can specify a fault direction from an EBAC image, and an inspection method using the sample inspection apparatus. Further, it is possible to provide a thin piece sample fabrication apparatus capable of fabricating a thin piece sample, so that a fault spot is cut in an appropriate direction based on information acquired by the sample inspection apparatus.

BRIEF DESCRIPTION OF DRAWINGS

FIG. 1 is a schematic diagram illustrating an inspection system according to Embodiment 1.

FIG. 2 is a schematic diagram illustrating a sample inspection apparatus in Embodiment 1.

FIG. 3 is a schematic diagram of a main part obtained by enlarging a part of the sample inspection apparatus in Embodiment 1.

FIG. 4 is a schematic diagram illustrating a CURR mode, a DIFF mode, and a DI-EBAC mode.

FIG. 5 is a conceptual diagram illustrating histograms obtained in the CURR mode, the DIFF mode and the DI-EBAC mode.

FIG. 6 is a graph illustrating a relationship between a differential value of a change in potential difference in the DI-EBAC mode and a position of a fault spot.

FIG. 7 is a flowchart illustrating a method for inspecting a sample (inspection means) in Embodiment 1.

FIG. 8A is a schematic diagram illustrating a DI-EBAC image in Embodiment 1.

FIG. 8B is a schematic diagram illustrating a SEM image in Embodiment 1.

FIG. 8C is a schematic diagram illustrating a combined image obtained by superimposing the SEM image and the DI-EBAC image in Embodiment 1.

FIG. 8D is a schematic diagram illustrating a combined image obtained by superimposing the SEM image and the DI-EBAC image in Embodiment 1.

FIG. 9 is a schematic diagram illustrating a thin piece sample fabrication apparatus according to Embodiment 1.

FIG. 10 is a flowchart illustrating a method for inspecting a sample (fabrication means) according to Embodiment 1.

FIG. 11 is a screen during operation of the thin piece sample fabrication apparatus in Embodiment 1.

DESCRIPTION OF EMBODIMENTS

Hereinafter, embodiments will be described in detail based on the accompanying drawings. Further, in all the drawings for describing the embodiments, members having the same functions are denoted by the same reference numerals, and repeated description thereof will be omitted. In the following embodiments, the description of the same or similar parts will not be repeated in principle unless particularly necessary.

Embodiment 1

<Configuration of Inspection System>

A configuration of an inspection system 100 capable of inspecting and fabricating a sample will be described below with reference to FIG. 1.

As illustrated in FIG. 1, the inspection system 100 includes a sample inspection apparatus 200, a thin piece sample fabrication apparatus 300, a computer 30, a display apparatus 31, an input apparatus 32, and a storage apparatus 33.

Various types of information are communicated between the sample inspection apparatus 200 and the thin piece sample fabrication apparatus 300 via the computer 30. The various types of information are information on the sample inspected by the sample inspection apparatus 200 and information on the sample fabricated by the thin piece sample fabrication apparatus 300, and include, for example, the positional coordinates of a fault spot, a fault direction, the positional coordinates of a fabrication spot, and image data. These pieces of information are stored in the storage apparatus 33 provided in the computer 30.

The display apparatus 31 and the input apparatus 32 are connected to the computer 30. A GUI screen or the like is displayed on the display apparatus 31. Image data such as an EBAC image and a SEM image, and various instructions of a user are displayed on the GUI screen. The user can input various instructions using the input apparatus 32 while checking the GUI screen. In this case, the various instructions are transmitted to the computer 30, and control signals are transmitted from the computer 30 to controllers of the sample inspection apparatus 200 and the thin piece sample fabrication apparatus 300.

The input apparatus 32 is, for example, a keyboard or a mouse, and the storage apparatus 33 is, for example, a flash memory or a hard disk. The computer 30 may be any apparatus capable of communicating information, and may be a network or other information medium.

<Configuration of Sample Inspection Apparatus>

The sample inspection apparatus 200 according to Embodiment 1 will be described below with reference to FIGS. 2 to 6. The sample inspection apparatus 200 is a charged particle beam apparatus, for example, a nanoprober.

As illustrated in FIG. 2, the sample inspection apparatus 200 includes a sample chamber 1 and a lens barrel 2 attached to the sample chamber 1. An electron source (charged particle source) 3 capable of emitting an electron beam (charged particle beam) EB1 and an electron optical system 4 capable of focusing and scanning the electron beam EB1 are provided inside the lens barrel 2. The electron optical system 4 includes, for example, a condenser lens 5, a scanning coil 6, and an objective lens 7.

A stage 8 which is three-dimensionally movable and on which a sample 11 can be placed is provided below the electron source 3 inside the sample chamber 1. Here, a case where the sample 11 including a fault spot 12 is placed on the stage 8 is shown.

The sample 11 includes a semiconductor substrate in which impurity regions of a p-type and an n-type are formed, a semiconductor element such as a transistor formed on the semiconductor substrate, and a wiring formed on the semiconductor element, and the like. Here, a case in which a conductor 11*a* and a conductor 11*b* configuring the wiring are formed on a surface of the sample 11, and the fault spot 12 exists between the conductors is shown.

The sample chamber 1 is provided with a detector 9, for example, a secondary electron detector. Secondary electrons generated from the sample 11 when the electron beam EB1 collides with the sample 11 are detected by the detector 9. The detected secondary electrons are converted into image data as an observation image (SEM image, secondary electron image) by image processing equipment or the like electrically connected to the detector 9. The image processing equipment is included in a controller C1, which will be described later.

The sample chamber 1 is provided with a probe 10*a* and a probe 10*b*. By bringing the probe 10*a* into contact with the conductor 11*a* and the probe 10*b* into contact with the conductor 11*b*, the current, the potential, the resistance value, and so on of the conductors 11*a* and 11*b* and the fault spot 12 can be measured. The probes 10*a* and 10*b* are electrically connected to a differential amplifier 20, and the differential amplifier 20 is electrically connected to image processing equipment included in the controller C1. Although the number of probes is two here, the number of probes may be one or three or more.

The controller C1 is electrically connected to the lens barrel 2 (electron source 3, electron optical system 4), the stage 8, the detector 9, the probes 10*a* and 10*b*, and controls their operations. Further, the controller C1 is electrically connected to the computer 30.

When the sample 11 is irradiated with the electron beam EB1, charges are accumulated in the sample 11, and a potential difference is generated between the conductors 11*a* and 11*b*. The potential difference generated between the conductors 11*a* and 11*b* is amplified by the differential amplifier 20, input as an output signal to the controller C1, and converted into image data as an EBAC image by the image processing equipment of the controller C1.

If there is no conduction between the conductors 11*a* and 11*b*, a potential difference occurs between the conductors. On the other hand, if there is conduction between the conductors, the potential difference does not occur between the conductors.

By observing the EBAC image, the presence or absence of conduction between the conductors 11*a* and 11*b* can be checked, and the spots of a short-circuit fault (fault in which there is conduction between conductors that should not have been conducted) and an open-circuit fault (fault in which there is no conduction between conductors that should have been conducted) can be specified.

The controller C1 can measure a signal output from the differential amplifier 20 for each irradiation position of the electron beam EB1 on the sample 11, and can create pixel gradation data according to intensity of the output signal. The controller C1 outputs the pixel gradation data as image data to the computer 30 each time scanning of one frame is completed, each time scanning of one line is completed, or each time scanning of one pixel is completed, according to a deflection speed of the electron beam EB1. The computer 30 displays the output image data on the display apparatus 31.

FIG. 3 is a schematic diagram illustrating a main part of the sample inspection apparatus 200 with a part thereof enlarged, and is a principle diagram for forming the EBAC image.

When the conductor 11*a* is irradiated with the electron beam EB 1 that is scanning the surface of the sample 11, an electric charge is transmitted through the probe 10*a* and is input to a positive side of the differential amplifier 20. In this case, when the fault spot 12 having a certain resistance value is in contact with the conductors 11a and 11b, an electric charge flows through the fault spot 12 to the conductor 11b, and the electric charge is transmitted through the probe 10b and input to a negative side of the differential amplifier 20. A potential of the conductor 11b is lower than that of the conductor 11a by a voltage drop due to the fault spot 12.

When the resistance value of the fault spot 12 is low, an amount of voltage drop is small and a potential difference between the conductors 11a and 11b is small, and thus the fault spot 12 can be recognized as being in the short-circuit fault. However, when the resistance value of the fault spot 12 is high, for example, when the resistance value of the fault spot 12 is greater than input impedance of the differential amplifier 20, the current through the fault spot 12 becomes difficult to flow. Therefore, there is a problem that a potential difference occurs between the conductors 11a and 11b, which makes it difficult to distinguish from a state where there is no fault spot 12.

In order to solve such a problem, the sample inspection apparatus 200 according to Embodiment 1 is provided with a differentiating circuit between the probes 10a and 10b and the differential amplifier 20. That is, between the probes 10a and 10b, a variable resistance element 21a electrically connected to the probe 10a, a constant voltage power supply 22a electrically connected to the variable resistance element 21a, a constant voltage power supply 22b electrically connected to the constant voltage power supply 22a, and a variable resistance element 21b electrically connected to the constant voltage power supply 22b and the probe 10b are provided. A capacitor 23a is provided between the variable resistance element 21a and the differential amplifier 20, and a capacitor 23b is provided between the variable resistance element 21b and the differential amplifier 20.

Further, in order to release an input bias current of the differential amplifier 20 to the ground and to protect the differential amplifier 20, a resistance element 24a is provided between the capacitor 23a and the differential amplifier 20, and a resistance element 24b is provided between the capacitor 23b and the differential amplifier 20.

Power is always supplied to the fault spot 12 in a state where the probe 10a is in contact with the conductor 11a and the probe 10b is in contact with the conductor 11b. That is, in the state described above, a voltage is always applied to the fault spot 12 from the constant voltage power supply 22a and the constant voltage power supply 22b.

When the fault spot 12 is irradiated with the electron beam EB1 scanning the surface of the sample 11, the fault spot 12 is heated by kinetic energy proportional to an acceleration voltage of the electron beam EB1, and the resistance value of the fault spot 12 increases. When the irradiation of the electron beam EB1 is finished, heat at the fault spot 12 is released to its surroundings. As a result, as the temperature of the fault spot 12 decreases, the resistance value of the fault spot 12 also returns to its original value. Therefore, the potential between the probes 10a and 10b changes greatly during a period when the fault spot 12 is irradiated with the electron beam EB1.

Generally, the sample 11 including the conductors 11a and 11b and the fault spot 12 have different changes in resistance value due to irradiation with the electron beam EB1 due to differences in thermal conductivity and temperature characteristics of resistance value. Therefore, even if the resistance value of the fault spot 12 is extremely high, by measuring the change in the potential difference between the probes 10a and 10b (the change in the resistance value of the fault spot 12), an output signal caused by the fault spot 12 can be detected.

Although the output signal may be directly detected by the differential amplifier 20, this output signal is minute compared to a conventional EBAC signal. Therefore, by differentiating the change in the potential difference between the probes 10a and 10b by the capacitors 23a and 23b and outputting a differential value of the change in potential difference to the differential amplifier 20, minute output signals can be detected with high accuracy. Since the output signal passes through the capacitors 23a and 23b, there is no influence of the input impedance of the differential amplifier 20. Further, by adjusting the resistance values of the variable resistance elements 21a and 21b, it is possible to cope with the fault spot 12 having any resistance value. For the detailed principle of the differential amplifier 20 including such a differentiating circuit, reference can be made to PTL 2 described above.

Thus, a dynamic induced electron beam absorbed current (DI-EBAC) image can be acquired by measuring the differential value of the change in the potential difference between the probes 10a and 10b (change in resistance value between probe 10a and probe 10b) while synchronizing with the scanning of the electron beam EB1.

FIG. 4 illustrates a mode in which an EBAC image is generated using the probe and the fault spot 12 is detected. FIG. 4 illustrates three detection methods of a CURR mode, a DIFF mode, and a DI-EBAC mode. The CURR mode is mainly used for detecting the open-circuit fault, the DIFF mode is mainly used for detecting a high resistance fault, and the DI-EBAC mode is mainly used for detecting the short-circuit fault.

In the CURR mode, the sample 11 is scanned with the electron beam EB1 with one probe 10a in contact with the conductor 11a, and a current value absorbed by the probe 10a is used as an output signal to generate an EBAC image 41. In this mode, when the electron beam EB1 is irradiated onto the conductor 11a, the current value detected by the probe 10a increases, and a portion having a large current value is displayed as a dark part.

In the DIFF mode, the sample 11 is scanned with the electron beam EB1 with the probe 10a in contact with the conductor 11a and the probe 10b in contact with the conductor 11b, and an EBAC image 42 is generated using the current values absorbed by the probes 10a and 10b as an output signal. Since the current values absorbed by the probes 10a and 10b change greatly in front of and behind the fault spot 12, the change is displayed as a bright part and a dark part.

In the DI-EBAC mode, the differential amplifier 20 and differentiating circuit illustrated in FIG. 3 are applied. The sample 11 is scanned with the electron beam EB1 with the probe 10a in contact with the conductor 11a and the probe 10b in contact with the conductor 11b, and an EBAC image (DI-EBAC image) 43 is generated using the differential value of the change in potential difference between the probes 10a and 10b as an output signal. In this mode, since the differential value of the change in the potential difference between the probe 10a and the probe 10b changes greatly according to the direction of the fault spot 12, the change is displayed as the bright part and the dark part.

FIG. 5 is a conceptual diagram of extracting the fault spot 12 using a histogram.

In the CURR mode, the horizontal axis in FIG. 5 indicates the change in current value absorbed by the probe 10a, and the vertical axis in FIG. 5 indicates the frequency of occurrence of the same change. Also, a baseline BL illustrated in the figure is a spot where the change in current value is the smallest or a spot where the frequency is the highest in a histogram 44.

In the CURR mode, the fault spot 12 is observed as a dark point, and thus, as illustrated in the histogram 44, a spot where the change in current value is sufficiently large relative to the baseline BL (where the change in current value is large on the negative side) is extracted as a dark part 46, and specified as the fault spot 12.

In the DIFF mode, the horizontal axis of FIG. 5 indicates changes in current values absorbed by the probes 10a and 10b, and the vertical axis of FIG. 5 indicates the frequency of occurrence of the same changes. The baseline BL illustrated in the figure is the spot where the change in the current value is the smallest or the spot where the frequency is the highest in a histogram 45.

In the DIFF mode, as shown in the histogram 45, a spot where the change in current value is sufficiently large on the negative side with respect to baseline BL is extracted as the dark part 46 and specified as the fault spot 12. Further, a spot where the change in current value is sufficiently large on the positive side relative to the baseline BL is extracted as a bright part 47 and specified as the fault spot 12.

In the DI-EBAC mode, the horizontal axis of FIG. 5 indicates the differential value of the change in potential difference between the probes 10a and 10b, and the vertical axis of FIG. 5 indicates the frequency of occurrence of the differential value. The baseline BL illustrated in the figure is the spot where the differential value is the smallest or the spot where the frequency is the highest in the histogram 45.

In the DI-EBAC mode, as illustrated in the histogram 45, a spot where the differential value is sufficiently large on the negative side relative to the baseline BL is extracted as the dark part 46 and specified as the fault spot 12. Further, a spot where the differential value is sufficiently large on the positive side relative to the baseline BL is extracted as the bright part 47 and specified as the fault spot 12.

Since most of the spots scanned by the electron beam EB1 are spots other than the fault spot 12, the frequency of spots other than the fault spot 12 inevitably increases. Further, as the distance from the fault spot 12 increases, the differential value of the change in the current value or the change in potential difference becomes smaller. Accordingly, by setting the baseline BL as described above, it becomes easier to specify the fault spot 12.

Since the spot where the change in current value is the largest or the spot where the differential value is the largest is the position of the fault spot 12, the fault spot 12 can be specified by limiting the spot from where the contrast is extracted (spot where dark part 46 or bright part 47 is extracted) to these spots.

FIG. 6 is a graph illustrating a relationship between the differential value of the change in potential difference and the position of the fault spot 12 in the DI-EBAC mode. The position of the fault spot 12 on the horizontal axis of FIG. 6 corresponds to the position of A-A' shown in the DI-EBAC image of FIG. 4.

As illustrated in FIG. 6, by extracting the differential value of the change in potential difference that is sufficiently large on the positive and negative sides from the histogram 45, the dark part 46 and the bright part 47 having large contrast can be displayed, and the fault spot 12 can be easily specified.

In the histograms 44 and 45, the spot to be extracted as the dark part 46 or bright part 47 may be selected by the user as appropriate, or may be automatically selected by the controller C1 by allowing artificial intelligence included in the controller C1 to perform machine learning on past data.

In the CURR mode or DI-EBAC mode, exceptionally, a bright point and a dark point may occur due to pn junction formed on the semiconductor substrate. Normally, electron-hole pairs generated by irradiation with electron beams are immediately recombined. However, in the vicinity of the pn junction, the generation of electron-hole pairs is accelerated and another electron is excited by an electric field, thereby causing EBAC reaction.

When performing extraction using the histogram as described above, for the same reason, the bright point and the dark point caused by the pn junction are also extracted, and these points may be misidentified as fault spots. On the other hand, the bright point and the dark point are included in spots other than the fault spot 12. Therefore, by extracting the dark part 46 and the bright part 47 as the fault spot 12 from the histogram, it is possible to generate image data from which the bright and dark points are removed. Therefore, misrecognition of the fault spot can be suppressed.

<Method for Inspecting Sample (Inspection Means)>

A method for inspecting the sample 11 using the sample inspection apparatus 200 will be described below with reference to FIGS. 7 and 8A to 8D. The method for inspecting the sample 11 is performed in the DI-EBAC mode described above. Further, among steps S1 to S6 of the method for inspecting the sample 11, steps S2 to S6 are inspection means executed when the sample 11 is placed on the stage 8, and can be said to be inspection means provided in the sample inspection apparatus 200.

First, in step S1, the user places the sample 11 on the stage 8 of the sample inspection apparatus 200, as illustrated in FIG. 2, for example.

In step S2, under the control of the controller C1, the surface of the sample 11 is scanned with the electron beam EB1 with the probe 10a in contact with the conductor 11a and the probe 10b in contact with the conductor lib. Next, the controller C1 measures the differential value of the change in potential difference between the probes 10a and 10b while synchronizing with the scanning of the electron beam EB1.

In step S3, the DI-EBAC image 43 in which the fault spot 12 existing between the conductor 11a and the conductor 11b is shown as the bright part 47 and the dark part 46 is acquired by the controller C1 based on the differential value of the change in potential difference measured in step S2.

That is, first, as illustrated in FIG. 5, the controller C1 generates the histogram 45 of the differential value of the change in potential difference measured in step S2. Next, the spot where the differential value of the change in potential difference is the smallest in the histogram 45 is set as the baseline BL, and the spot where the differential value of the change in potential difference is sufficiently large relative to the baseline BL is specified as the fault spot 12. Next, the controller C1 acquires the DI-EBAC image 43 in which the specified fault spot 12 is shown as the bright part 47 and the dark part 46.

Further, a work of specifying the fault spot 12 from the baseline BL, that is, a work of extracting which portion as the dark part 46 or the bright part 47 may be appropriately selected by the user, or may be automatically selected by the controller C1 by causing the artificial intelligence included in the controller C1 to perform machine learning on past data.

In step S4, as illustrated in FIG. 8A, the direction of the fault spot 12 is specified from the DI-EBAC image 43 acquired in step S3, and a direction 48 of the fault spot 12 is displayed on the DI-EBAC image 43. Here, an arrow is displayed on the DI-EBAC image 43 as a method of indicating the direction 48, but the method of indicating the direction 48 is not limited to the arrow, and other methods may be used.

The direction 48 of the fault spot 12 is specified as a direction perpendicular to the boundary between the bright part 47 and the dark part 46. The work of specifying the direction 48 may be performed by the user or by artificial intelligence included in the controller C1.

In step S5, as illustrated in FIG. 8B, the secondary electrons generated from the sample 11 are detected by the detector 9 by the controller C1 while synchronizing with the scanning of the electron beam EB1 in step S2 to acquire an SEM image 49 in which the conductors 11a and 11b are captured. The probe 10a and the probe 10b are also imaged in the SEM image 49.

In step S6, as illustrated in FIG. 8C, a superimposed image (combined image) 50 obtained by superimposing the SEM image 49 and the DI-EBAC image 43 is acquired by the controller C1. Although the positional relationship between the fault spot 12 and the conductor 11a, the conductor 11b, and so on is not clear from only the DI-EBAC image 43, the position of the fault spot 12 can be specified by generating the combined image 50.

Here, in step S5, instead of acquiring the SEM image 49, a CAD image may be fetched into the controller C1. Then, in step S6, the superimposed image (combined image) 50 obtained by superimposing the CAD image and the DI-EBAC image 43 may be acquired. The CAD image is design data of the sample 11 and data showing the conductors 11a and 11b. Therefore, even when the CAD image is applied, the position of the fault spot 12 can be specified.

As illustrated in FIG. 8D, in step S3, only a spot where the differential value of the change in the potential difference is particularly large may be extracted from the histogram 45 to generate the DI-EBAC image. In this case, by superimposing the DI-EBAC image on the SEM image 49 or the CAD image to generate a combined image 51, the position of the fault spot 12 can be specified with higher accuracy.

In order to improve visibility, the DI-EBAC image 43 may be superimposed on the SEM image 49 or the CAD image after the DI-EBAC image 43 is colored.

As described above, according to Embodiment 1, it is possible to provide the sample inspection apparatus 200 capable of specifying the direction 48 of the fault spot 12 and the inspection method using the sample inspection apparatus 200. Thus, for example, the direction of short-circuiting in the short-circuit fault can be specified. Therefore, when cross-section observation of the fault spot 12 is performed using the thin piece sample fabrication apparatus 300, the concern that the fault spot 12 is cut in an inappropriate direction and information on the fault spot 12 is lost can be suppressed.

In the method for inspecting the sample described above, although the DI-EBAC image 43 in the DI-EBAC mode has been described, steps S1 to S7 can also be performed for the EBAC image 41 in the CURR mode and the EBAC image 42 in the DIFF mode illustrated in FIG. 4.

In the CURR mode and the DIFF mode, it is known in advance that the direction of the fault spot 12 is the horizontal direction in FIG. 4. However, by using the histogram 44 and the histogram 45 illustrated in FIG. 5 and extracting the dark part 46 and the bright part 47 where the change in current value is sufficiently large relative to the baseline BL, the fault spot 12 can be specified as a clearer contrast. By generating a combined image obtained by superimposing the EBAC image 41 or EBAC image 42 having clearer contrast and the SEM image 49 or CAD image, the position of the fault spot 12 can be easily specified.

<Structure of Thin Piece Sample Fabrication Apparatus>

The thin piece sample fabrication apparatus 300 according to Embodiment 1 will be described below with reference to FIG. 9. The thin piece sample fabrication apparatus 300 is a charged particle beam apparatus, for example, an FIB-SEM apparatus.

The thin piece sample fabrication apparatus 300 includes a sample chamber 61, and an ion beam column 62 and an electron beam column 64 attached to the sample chamber 61.

The ion beam column 62 includes all components necessary for an FIB apparatus, such as an ion source 63 capable of emitting an ion beam (charged particle beam) IB, a lens for focusing the ion beam IB, and a deflection system for scanning and shifting the ion beam IB.

The electron beam column 64 includes all components necessary for an SEM apparatus, such as an electron source 65 capable of emitting an electron beam (charged particle beam) EB2, a lens for focusing the electron beam EB2, and a deflection system for scanning and shifting the electron beam EB2.

The ion beam IB that has passed through the ion beam column 62 and the electron beam EB2 that has passed through the electron beam column 64 are mainly focused on a cross point CP, which is an intersection point between an optical axis of the ion beam column and an optical axis of the electron beam column.

Here, although the ion beam column 62 is disposed vertically and the electron beam column 64 is disposed obliquely, but is not limited to this, and the ion beam column 62 may be disposed obliquely and the electron beam column 64 may be disposed vertically. Both the ion beam column 62 and the electron beam column 64 may be disposed obliquely.

A stage 66 which is three-dimensionally movable and on which the sample 11 can be placed is provided inside the sample chamber 61. The stage 66 is provided at a position where the sample 11 is irradiated with the ion beam IB and the electron beam EB2.

The sample chamber 1 is provided with a detector 67 such as a secondary electron detector, for example. Secondary electrons generated from the sample 11 when the electron beam EB2 collides with the sample 11 are detected by the detector 67. The detected secondary electrons are converted into image data as an observation image (SEM image, secondary electron image) by image processing equipment or the like electrically connected to the detector 67. The image processing equipment is included in a controller C2, which will be described later. The detector 67 may also be a composite charged particle detector capable of detecting ions as well as electrons.

An attachment and detachment device 68 is provided in the sample chamber 61, so that the sample 11 can reach a position irradiated with the ion beam IB and the electron beam EB1. The attachment and detachment device 68 is three-dimensionally movable and is, for example, a nanotweezer or a microprobe.

The controller C2 is electrically connected to the ion beam column 62, the electron beam column 64, the stage 66, the detector 67 and the attachment and detachment device 68, and controls their operations. The controller C2 is electrically connected to the computer 30.

By irradiating the sample 11 with the ion beam IB while checking the SEM image generated by the electron beam column 64, a part of the sample 11 can be processed, and a thin piece sample including the cross section of the fault spot 12 can be fabricated. The fabricated thin piece sample can be obtained from the sample 11 by operating the attachment and detachment device 68.

<Method for Inspecting Sample (Fabrication Means)>

A method for inspecting the sample 11 performed using the thin piece sample fabrication apparatus 300 will be described below with reference to FIGS. 10 and 11. Steps S7 to S10 illustrated in FIG. 10 are the method for inspecting the sample 11 subsequent to steps S1 to S6 in FIG. 7. Steps S8 to S10 are fabrication means executed when the sample 11 is placed on the stage 66, and can also be said to be fabrication means provided in the thin piece sample fabrication apparatus 300.

In step S7, first, the sample 11 is transported from the sample inspection apparatus 200 to the thin piece sample fabrication apparatus 300. Next, for example, as illustrated in FIG. 9, the user places the sample 11 on the stage 66 of the thin piece sample fabrication apparatus 300.

In step S8, the combined image 50 acquired in step S6 and the information on the direction 48 of the fault spot 12 specified in step S4 are fetched from the controller C1 to the controller C2. The direction 48 of the fault spot 12 is then shown in the combined image 50.

For example, as illustrated in FIG. 11, the GUI screen of the display apparatus 31 is provided with a display button 34 of a fault position and a display button 35 of a fault direction. When the user presses the display button 34, the combined image 50 is displayed on the GUI screen of the display apparatus 31. When the user presses the display button 35, the direction 48 is displayed on the GUI screen of the display apparatus 31.

The direction 48 may be automatically shown in the combined image 50 by the controller C1 regardless of the user's selection. That is, it is sufficient that the combined image 50 showing the direction 48 is fabricated before step S9, which will be described later.

In step S9, the cutting direction of the sample 11 is determined with reference to the direction 48 of the fault spot 12 shown in the combined image 50. This determination work may be performed by the user, or may be performed by artificial intelligence included in the controller C1.

In step S10, based on the cutting direction determined in step S9, the controller C1 irradiates the sample 11 with the ion beam IB to process a part of the sample 11, thereby fabricating a thin piece sample including the cross section of the fault spot 12.

As described above, according to Embodiment 1, the thin piece sample fabrication apparatus 300 that can fabricate a thin piece sample, based on the information acquired by the sample inspection apparatus 200, so that the fault spot 12 is cut in an appropriate direction can be provided.

Although not illustrated in FIG. 1, the inspection system 100 includes a charged particle beam apparatus for analysis which is electrically connected to the computer 30. Such a charged particle beam apparatus is, for example, a transmission electron microscope (TEM). The thin piece sample fabricated in step S10 is transported to the transmission electron microscope. Then, inside the transmission electron microscope, the cross section of the fault spot 12 is analyzed in detail.

Although the present invention has been specifically described above based on the embodiments described above, the present invention is not limited to the embodiments described above, and various modifications can be made without departing from the scope of the invention.

REFERENCE SIGNS LIST

1: sample chamber
2: lens barrel
3: electron source
4: electron optical system
5: condenser lens
6: scanning coil
7: objective lens
8: stage
9: detector
10a, 10b: probe
11: sample
11a, 11b: conductor
12: fault spot
20: differential amplifier
21a, 21b: variable resistance element
22a, 22b: constant voltage power supply
23a, 23b: capacitor
24a, 24b: resistance element
30: computer
31: display apparatus
32: input apparatus
33: storage apparatus
34: display button of fault position
35: display button of fault direction
41-43: EBAC images
44, 45: histogram
46: dark part
47: bright part
48: direction of fault spot
49: SEM image
50, 51: combined image (superimposed image)
61: sample chamber
62: ion beam column
63: ion source
64: electron beam column
65: electron source
66: stage
67: detector
68: attachment and detachment device
100: inspection system
200: sample inspection apparatus
300: thin piece sample fabrication apparatus
BL: baseline
C1: first controller
C2: second controller
CP: cross point
EB1, EB2: electron beam
IB: ion beam

The invention claimed is:

1. A sample inspection apparatus comprising:
an electron source capable of emitting an electron beam;
an electron optical system capable of focusing and scanning the electron beam;
a first stage on which a sample having a first conductor and a second conductor formed on a surface thereof can be placed;
a detector for detecting secondary electrons generated from the sample when the sample is irradiated with the electron beam;
a first probe;
a second probe;
a first controller that controls an operation of each of the electron source, the electron optical system, the first stage, the detector, the first probe, and the second probe; and an inspection means that is executed when the sample is placed on the first stage, wherein the inspection means includes the steps of (a) scanning the surface of the sample with the electron beam with the first probe in contact with the first conductor and the second probe in contact with the second conductor, (b) measuring a differential value of a change in potential difference between the first probe and the second probe while synchronizing with the scanning of the electron beam in the step (a), (c) acquiring a DI-EBAC image in which a fault spot existing between the first conductor and the second conductor is shown as a bright part and a dark part based on the differential value of the change in the potential difference measured in the step (b), and (d) specifying a direction of the fault spot from the DI-EBAC image acquired in the step (c).

2. The sample inspection apparatus according to claim 1, wherein the step (c) includes the steps of (c1) generating a histogram of the differential value of the change in the potential difference measured in the step (b), (c2) setting a spot in the histogram where the differential value of the change in the potential difference is the smallest as a baseline and specifying a spot where the differential value of the change in the potential difference is sufficiently large with respect to the baseline as the fault spot, and (c3) acquiring the DI-EBAC image in which the fault spot specified in the step (c2) is shown as the bright part and the dark part.

3. The sample inspection apparatus according to claim 1, wherein in the step (d), a direction perpendicular to a boundary between the bright part and the dark part is specified as the direction of the fault spot.

4. The sample inspection apparatus according to claim 1, wherein the first probe and the second probe are electrically connected to the first controller via a differential amplifier, between the first probe and the second probe, a first variable resistance element electrically connected to the first probe, a first constant voltage power supply electrically connected to the first variable resistance element, a second constant voltage power supply electrically connected to the first constant voltage power supply, and a second variable resistance element electrically connected to the second constant voltage power supply and the second probe are provided, a first capacitor is provided between the first variable resistance element and the differential amplifier, a second capacitor is provided between the second variable resistance element and the differential amplifier, and in the step (a), a voltage is always applied to the fault spot from the first constant voltage power supply and the second constant voltage power supply.

5. The sample inspection apparatus according to claim 1, wherein the inspection means further includes the steps of (e) acquiring a SEM image in which the first conductor and the second conductor are captured by detecting secondary electrons generated from the sample by the detector while synchronizing with the scanning of the electron beam in the step (a), and (f) specifying the position of the fault spot by acquiring a first combined image obtained by superimposing the SEM image and the DI-EBAC image.

6. An inspection system comprising:

the sample inspection apparatus according to claim 5; and a thin piece sample fabrication apparatus, wherein the thin piece sample fabrication apparatus further includes an ion source capable of emitting an ion beam, a second stage on which the sample can be placed, a second controller that controls an operation of each of the ion source and the second stage and is electrically connected to the first controller, and a fabrication means executed when the sample is placed on the second stage, the fabrication means includes the steps of (g) fetching the first combined image acquired in the step (f) and information on the direction of the fault spot specified in the step (d) from the first controller to the second controller, (h) after the step (g), showing the direction of the fault spot in the first combined image, (i) after the step (h), determining a cutting direction of the sample with reference to the direction of the fault spot, and (j) after the step (i), irradiating the sample with the ion beam based on the cutting direction and processing a part of the sample to fabricate a thin piece sample including a cross section of the fault spot.

7. The sample inspection apparatus according to claim 1, wherein the inspection means further includes the steps of (e) fetching a CAD image, which is design data of the sample and in which the first conductor and the second conductor are shown, into the first controller, and (f) specifying the position of the fault spot by acquiring a second combined image obtained by superimposing the CAD image and the DI-EBAC image.

8. An inspection system comprising:

the sample inspection apparatus according to claim 7; and a thin piece sample fabrication apparatus, wherein the thin piece sample fabrication apparatus further includes an ion source capable of emitting an ion beam, a second stage on which the sample can be placed, a second controller that controls an operation of each of the ion source and the second stage and is electrically connected to the first controller, and a fabrication means executed when the sample is placed on the second stage, the fabrication means includes the steps of (g) fetching the second combined image acquired in the step (f) and information on the direction of the fault spot specified in the step (d) from the first controller to the second controller, (h) after the step (g), showing the direction of the fault spot in the second combined image, (i) after the step (h), determining a cutting direction of the sample with reference to the direction of the fault spot, and (j) after the step (i), irradiating the sample with the ion beam based on the cutting direction and processing a part of the sample to fabricate a thin piece sample including a cross section of the fault spot.

9. A thin piece sample fabrication apparatus comprising:

an ion source capable of emitting an ion beam;

a second stage on which a sample having a first conductor and a second conductor formed on a surface thereof can be placed;

a second controller that controls an operation of each of the ion source and the second stage; and a fabrication means executed when the sample is placed on the second stage, wherein the fabrication means includes the steps of (a) fabricating a combined image, which is obtained by superimposing a SEM image in which the first conductor and the second conductor are captured or a CAD image which is design data of the sample and in which the first conductor and the second conductor are shown, and a DI-EBAC image in which a fault spot existing between the first conductor and the second conductor is shown as a bright part and a dark part, and in which a direction of the fault spot is shown, (b) after the step (a), determining a cutting direction of the sample with reference to the direction of the fault spot shown in the combined image, and (c) after the step (b), irradiating the sample with the ion beam based on the cutting direction and processing a part of the sample to fabricate a thin piece sample including a cross section of the fault spot.

10. The thin piece sample fabrication apparatus according to claim 9, wherein the combined image is image data acquired by a sample inspection apparatus, and the sample inspection apparatus includes an electron source capable of emitting an electron beam, an electron optical system capable of focusing and scanning the electron beam, a first stage on which the sample can be placed, a detector for detecting secondary electrons generated from the sample when the sample is irradiated with the electron beam, a first probe, a second probe, and a first controller that controls an operation of each of the electron source, the electron optical system, the first stage, the detector, the first probe, and the second probe.

11. A method for inspecting a sample performed using a sample inspection apparatus and a thin piece sample fabrication apparatus, the sample inspection apparatus including an electron source capable of emitting an electron beam, an electron optical system capable of focusing and scanning the electron beam, a first stage on which a sample having a first conductor and a second conductor formed on a surface thereof can be placed, a detector for detecting secondary electrons generated from the sample when the sample is irradiated with the electron beam, a first probe, a second probe, and a first controller that controls an operation of each of the electron source, the electron optical system, the first stage, the detector, the first probe, and the second probe, and the thin piece sample fabrication apparatus including an ion source capable of emitting an ion beam, a second stage on which the sample can be placed, and a second controller that controls an operation of each of the ion source and the second stage and is electrically connected to the first controller, the method comprising the steps of:

(a) placing the sample on the first stage;

(b) after the step (a), scanning the surface of the sample with the electron beam with the first probe in contact with the first conductor and the second probe in contact with the second conductor;

(c) measuring a differential value of a change in potential difference between the first probe and the second probe while synchronizing with the scanning of the electron beam in the step (b);

(d) acquiring a DI-EBAC image in which a fault spot existing between the first conductor and the second conductor is shown as a bright part and a dark part based on the differential value of the change in the potential difference measured in the step (c);

(f) specifying a direction of the fault spot from the DI-EBAC image acquired in the step (d);

(g) acquiring a SEM image in which the first conductor and the second conductor are imaged by detecting secondary electrons generated from the sample with the detector while synchronizing with the scanning of the electron beam in the step (a) or fetching a CAD image, which is design data of the sample and in which the first conductor and the second conductor are shown, into the first controller;

(h) after the step (f) and the step (g), specifying the position of the fault spot by acquiring a combined image obtained by superimposing the SEM image or the CAD image and the DI-EBAC image;

(i) after the step (h), transporting the sample from the sample inspection apparatus to the thin piece sample fabrication apparatus and placing the sample on the second stage;

(j) fetching the combined image acquired in the step (h) and information on the direction of the fault spot specified in the step (f) from the first controller to the second controller;

(k) after the step (j), showing the direction of the fault spot in the combined image;

(l) after the step (k), determining a cutting direction of the sample with reference to the direction of the fault spot; and (m) after the step (l), irradiating the sample with the ion beam based on the cutting direction and processing a part of the sample to fabricate a thin piece sample including a cross section of the fault spot.

12. The method for inspecting the sample according to claim 11, wherein the step (d) includes the steps of (d1) generating a histogram of the differential value of the change in the potential difference measured in the step (c), (d2) setting a spot in the histogram where the differential value of the change in the potential difference is the smallest as a baseline and specifying a spot where the differential value of the change in the potential difference is sufficiently large with respect to the baseline as the fault spot, and (d3) acquiring the DI-EBAC image in which the fault spot specified in the step (d2) is shown as the bright part and the dark part.

13. The method for inspecting the sample according to claim 11, wherein in the step (f), a direction perpendicular to a boundary between the bright part and the dark part is specified as the direction of the fault spot.

14. The method for inspecting the sample according to claim 11, wherein the first probe and the second probe are electrically connected to the first controller via a differential amplifier, between the first probe and the second probe, a first variable resistance element electrically connected to the first probe, a first constant voltage power supply electrically connected to the first variable resistance element, a second constant voltage power supply electrically connected to the first constant voltage power supply, and a second variable resistance element electrically connected to the second constant voltage power supply and the second probe are provided, a first capacitor is provided between the first variable resistance element and the differential amplifier, a second capacitor is provided between the second variable resistance element and the differential amplifier, and in the step (b), a voltage is always applied to the fault spot from the first constant voltage power supply and the second constant voltage power supply.

* * * * *